United States Patent
Grooms et al.

(10) Patent No.: US 12,316,093 B2
(45) Date of Patent: May 27, 2025

(54) POWER SUPPLY SYSTEM HAVING A CIRCUIT FOR DETECTING A GROUND FAULT

(71) Applicant: Sumitomo Wiring Systems, Ltd., Yokkaichi (JP)

(72) Inventors: Robert Grooms, Farmington Hills, MI (US); Vibhor Singh, Farmington Hills, MI (US)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 309 days.

(21) Appl. No.: 18/193,246

(22) Filed: Mar. 30, 2023

(65) Prior Publication Data

US 2024/0333278 A1 Oct. 3, 2024

(51) Int. Cl.
*H02H 3/16* (2006.01)
*H02J 9/06* (2006.01)
*B60R 16/033* (2006.01)
*H03K 17/082* (2006.01)

(52) U.S. Cl.
CPC ............. *H02H 3/16* (2013.01); *H02J 9/061* (2013.01); *B60R 16/033* (2013.01); *H03K 17/0822* (2013.01)

(58) Field of Classification Search
CPC ............................ H02H 3/16; H02J 9/00–08
See application file for complete search history.

(56) References Cited

U.S. PATENT DOCUMENTS

| | | |
|---|---|---|
| 2006/0007626 A1 | 1/2006 | Ohshima |
| 2014/0376134 A1* | 12/2014 | Hunter ................ H10D 89/814 |
| | | 361/88 |
| 2019/0109453 A1* | 4/2019 | Neyman ................ H02H 3/08 |
| 2022/0140646 A1 | 5/2022 | Takahashi |
| 2024/0063301 A1* | 2/2024 | Sharma ............... H10D 62/117 |

FOREIGN PATENT DOCUMENTS

JP 2015109741 A 6/2015

* cited by examiner

*Primary Examiner* — Jared Fureman
*Assistant Examiner* — Christopher J Clark
(74) *Attorney, Agent, or Firm* — Honigman LLP

(57) ABSTRACT

A power supply system and a control circuit for a power supply system are provided. The power supply system includes a first battery, a second battery, a first switch and a second switch are operable to control power supply from the first and second battery by turning on and off. The control circuit includes a third switch. A drain of the third switch is connected to the gates of the first and second switches and a source of the third switch is connected to the source of the first and the second switches. In the event of a ground fault, a voltage at the gate and source of the third switch is the same, turning on the third switch voltage wherein a voltage at the gates and sources of the first and second switches are made equal, turning off the first and second switches.

20 Claims, 5 Drawing Sheets

POWER SUPPLY SYSTEM HAVING A CIRCUIT FOR DETECTING A GROUND FAULT

TECHNICAL FIELD

This disclosure relates to a power supply system and in particular a circuit for a power supply system.

BACKGROUND

With reference now to FIG. 1, a conventional power supply system is provided. The power supply system may be illustratively implemented in an automotive vehicle and includes a first battery and a second battery configured to power various loads. In the context of an automotive vehicle, the first battery may be configured to power a motor and the second battery may be configured to provide power to various loads of the automotive vehicle, such as windshield wipers, turn signals and the like. The second battery may be further configured to provide auxiliary power to the motor, charge the first battery and the like. Likewise, the first battery may be configured to supply power to various loads in the automotive vehicle in addition to the motor.

Power from the first battery and the second battery are controlled by a first switch and a second switch. Conventional power supply systems utilize a Field-Effect Transistor (FET) for a switch, commonly referred to as a MOSFET, to control the power supply from the first and second batteries. However, a surge of power resulting from a ground fault, e.g., a disconnection from ground, may impair or otherwise damage the first and second switches.

Conventional power supply systems include a controller, such as a Computer Processing Unit (CPU), to control the operation of the first and second switches. As an example, the CPU sends a signal to the gates of the first and second switches to turn on or off the switches in order to supply power or disconnect power from the first and second batteries. Conventional power supply systems include voltage and current detectors configured to detect a ground fault. The ground fault is transmitted to the CPU, and the CPU may then send a signal to the gates of the first and second switches so as to turn off the first and second switches, thus preventing a power surge from damaging the first and second switches.

However, it may be that signal to turn off the first and second switches is submitted after the first and second switches have already received a power surge. It may also be the case that a ground fault damages the CPU, in which case, the CPU is not able to send a signal to turn off the first and second switches.

Accordingly, it remains desirable to have a power supply system with a circuit configured to turn off the first and second switches in the event of a ground fault.

SUMMARY

In one aspect, a control circuit for a power supply system is provided. The power supply system includes a first battery and a second battery, and a first switch and a second switch are coupled to the first battery and the second battery respectively and are operable to control the power supply from the first and second battery by turning on and off. The first switch includes a first source, a first drain and a first gate. The second switch includes a second source, a second drain and a second gate.

The control circuit is operatively coupled to the first and the second switches. The control circuit includes a third switch having a third source, a third drain and a third gate. The third drain is connected to the first gate and the second gate of the first switch and the second switch and the third source is connected to the first source and the second source of the first switch and the second switch, and the third gate is connected to ground, wherein in the event of a short caused by a disconnection to the ground, a voltage at the third gate and third source of the third switch is the same, turning on the third switch and shorting the first gate, first source, the second gate and the second source of the first switch and the second switch so as to turn off the first switch and the second switch.

In one aspect, the first switch and the second switch are an N-channel Field-Effect Transistors (FET).

In another aspect, the third switch is a depletion only type transistor. As an example of a depletion only type transistor, the third switch may be a JFET.

In one aspect, the control circuit further includes a first resistor interposed between the third gate and the third source of the third switch.

In another aspect of the control circuit, the control circuit includes a first diode interposed between the first gate and the second gate and the third drain of the third switch.

In one aspect, the control circuit further includes a second resistor interposed between the first gate and the second gate and the third drain of the third switch.

In another aspect, the control circuit further includes a first diode interposed between the first gate and the second gate and the third drain of the third switch. In such an aspect, the second resistor interposed between the first diode and the third drain of the third switch.

In another aspect, the control circuit further includes a third resistor interposed between the third gate of the third switch and a ground.

In another aspect, the control circuit further includes a first Zener diode interposed between the third gate and the third drain.

In another aspect, the control circuit further includes a second Zener diode and a third Zener diode, the second Zener diode and the third Zener diode are interposed between the third gate and the third source of the third switch. In such an aspect, a cathode of the second Zener diode and a cathode of the third Zener diode face each other.

In another aspect of the disclosure, a power supply system is provided. The power supply system may be incorporated into an automotive vehicle. The power supply system includes a first battery having a first capacitance and a second battery having a second capacitance that is different from the first capacitance. The power supply system further includes a first switch and a second switch. The first switch includes a first source, a first drain and a first gate. The second switch includes a second source, a second drain and a second gate. The first switch and the second switch are configured to turn on and off the power supply from the first battery and the second battery, respectively.

The power supply system further includes a control circuit. The control circuit includes a third switch having a third source, a third drain and a third gate. The third drain is connected to both the first gate and the second gate of the first switch and the second switch, and the third source is connected to the first source and the second source of the first switch and the second switch. The third gate is connected to ground, wherein in the event of a short caused by a disconnection to the ground, a voltage at the third gate and third source of the third switch is the same, turning on the third switch and shorting the first gate, first source, the second gate, and the second source of the first switch and the second switch so as to turn off the first switch and the second switch.

In one aspect of the power supply system, the first switch and the second switch are N-channel Field-Effect Transistors (FET).

In another aspect of the power supply system, the third switch is a depletion only type transistor such as a JFET.

In another aspect of the power supply system, the power supply system may further include a first resistor interposed between the third gate and the third source of the third switch. In such an aspect, the power supply system may further include a first diode and a second resistor, the first diode is interposed between the first gate and the second gate and the third drain of the third switch, and the second resistor interposed between the first diode and the third drain of the third switch.

In yet another aspect, the power supply system may further include a third resistor interposed between the third gate of the third switch and a ground. In such an aspect, the power supply system may further include a first Zener diode, a second Zener diode and a third Zener diode. The first Zener diode is interposed between the third gate and the third drain, and the second Zener diode and the third Zener diode are interposed between the third gate and the third source of the third switch.

Accordingly, a power supply system and a control circuit are provided which is operable to turn off the first and second switches in the event of a ground fault so as to protect the first and second switches from being damaged from an over current.

DETAILED DESCRIPTION

A power supply system and a control circuit for a power supply system are provided. The power supply system includes a first battery, a second battery, a first switch and a second switch. The first switch and the second switch are coupled to the first battery and the second battery respectively, and are operable to control the power supply from the first and second battery by turning on and off. The first switch includes a first source, a first drain and a first gate. The second switch includes a second source, a second drain and a second gate.

The control circuit is operatively coupled to the first and the second switches. The control circuit includes a third switch having a third source, a third drain and a third gate. The third drain is connected to the first gate and the second gate of the first switch and the second switch and the third source is connected to the first source and the second source of the first switch and the second switch, and the third gate is connected to ground, wherein in the event of a short caused by a disconnection to the ground, a voltage at the third gate and third source of the third switch is the same, turning on the third switch and shorting the first gate, first source, the second gate and the second source of the first switch and the second switch so as to turn off the first switch and the second switch.

Figure 1:
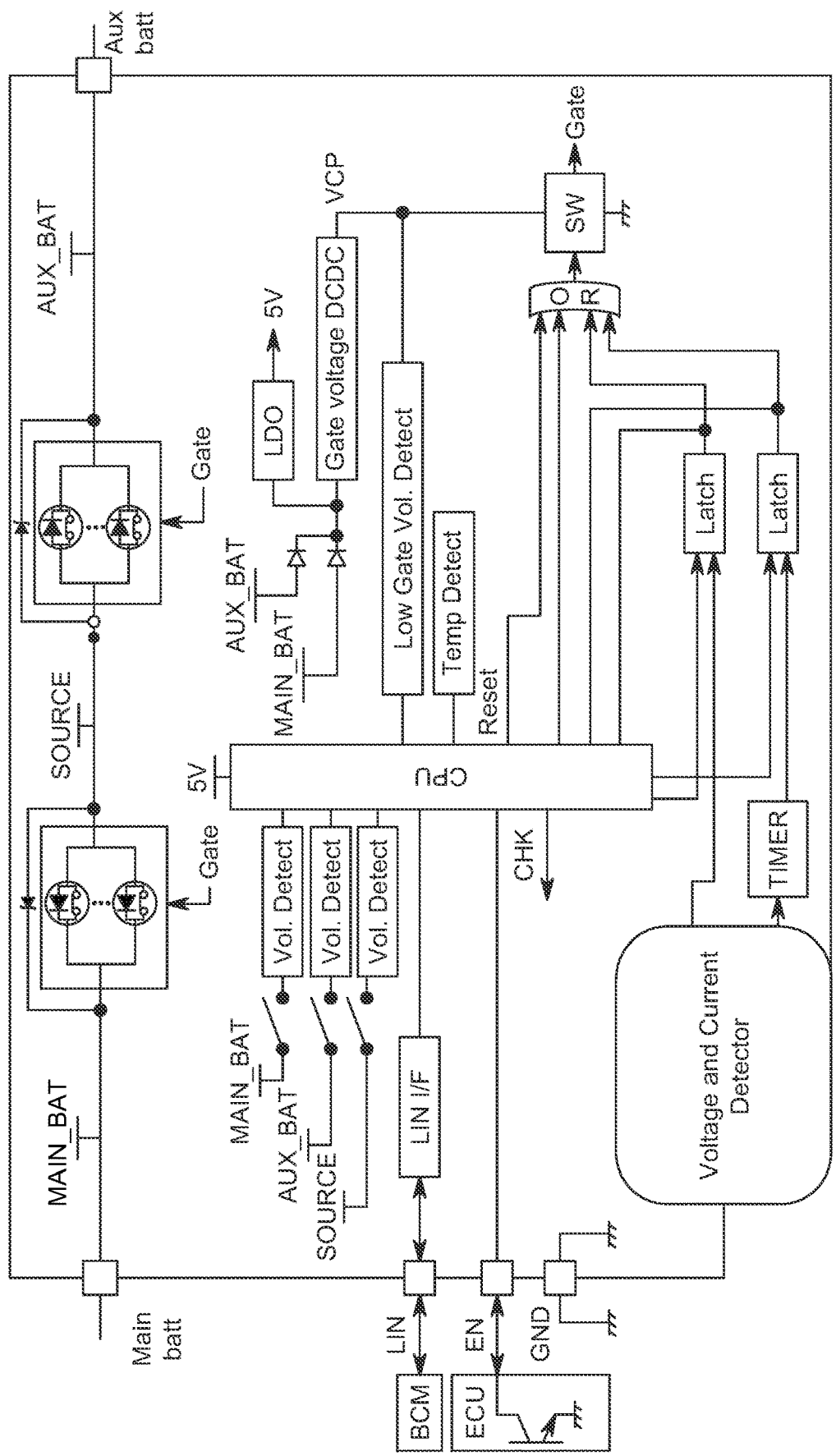
FIG. 1 is a schematic view of a conventional power supply system.
Figure 2A:
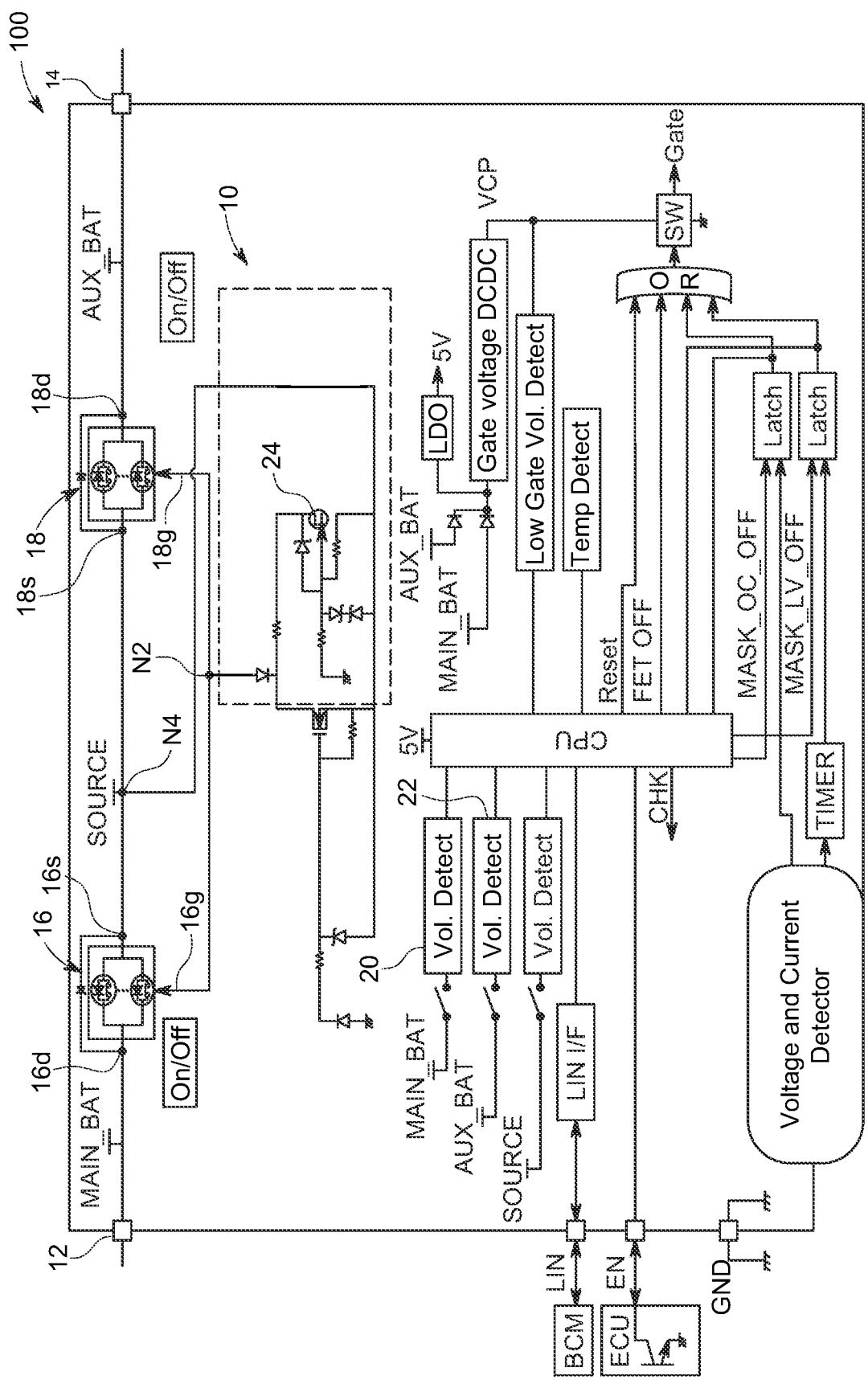
FIG. 2A is an illustrative schematic view of a power supply system according to one or more aspects described herein.
Figure 2B:
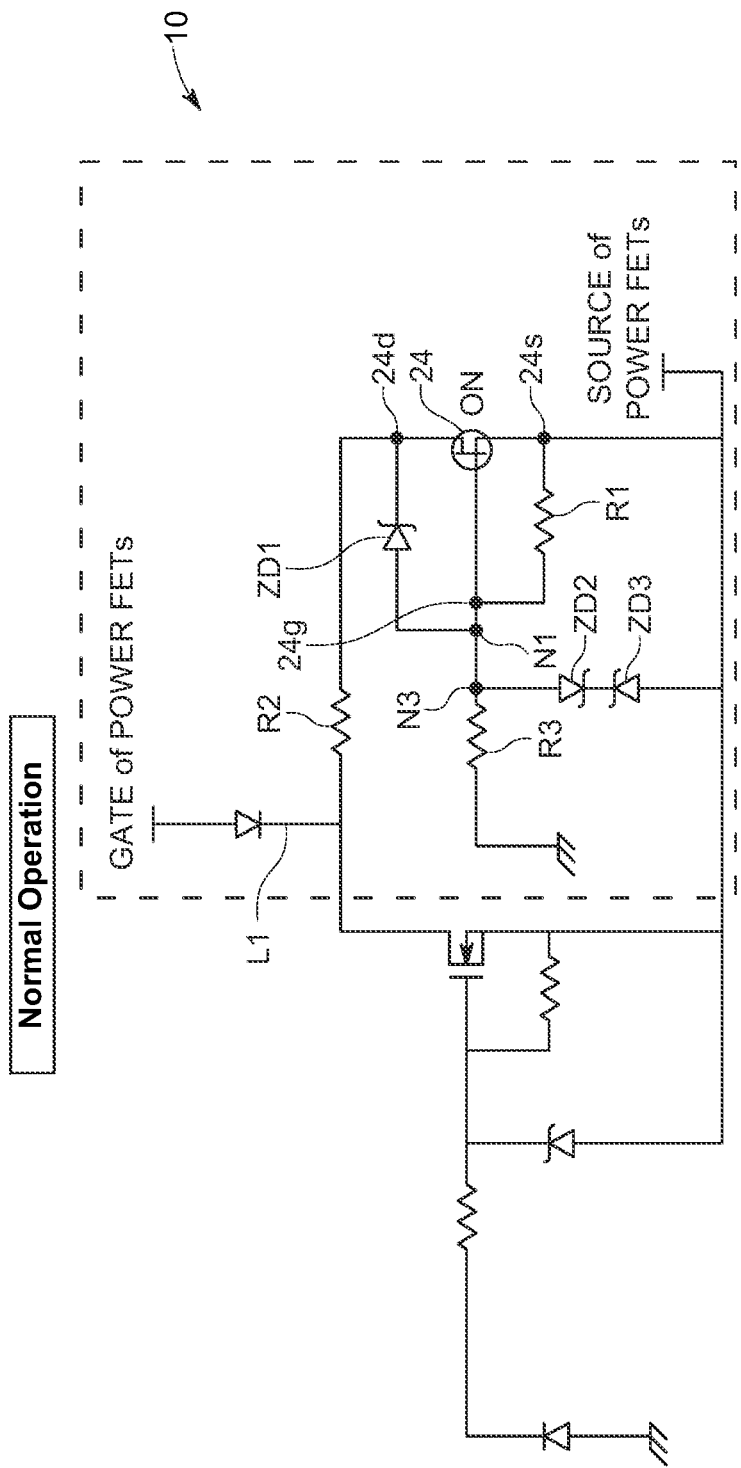
FIG. 2B is a schematic view of the control circuit shown in FIG. 2A in normal connection conditions.

With reference now to FIGS. 2A and 2B, a depiction of a control circuit 10 is provided. The control circuit 10 is electrically connected to a power supply system 100. The power supply system 100 includes a first battery 12 and a second battery 14. As used herein, the term "battery" is not limited to a singular cell, but may be construed as a unit including multiple battery cells. The first battery 12 includes a first capacitance, and the second battery 14 includes a second capacitance. In one aspect, the first capacitance is different than the second capacitance. In such an aspect, the first capacitance is greater than the second capacitance. However, it should be appreciated that the first capacitance may be the same as the second capacitance without deviating from the scope of the appended claims.

The power supply system 100 further includes a first switch 16 and a second switch 18. The first switch 16 and the second switch 18 are MOSFETs which require a predetermined voltage differential between the gate and the source to be turned on. Preferably, the MOSFETs are configured to turn on when the differential between the gate and the source is between 2 to 3 volts. In one aspect, the first switch 16 and the second switch 18 are N-channel MOSFETs. The first switch 16 and the second switch 18 are coupled to the first battery 12 and the second battery 14, respectively, and are operable to control the power supply from the first and second batteries 12, 14, by turning the first and second switches 16, 18 on and off.

The first switch 16 includes a first source 16s, a first drain 16d and a first gate 16g. The second switch 18 includes a second source 18s, a second drain 18d and a second gate 18g. The first drain 16d is coupled to the first battery 12 and the first source 16s is coupled to a system load (not shown). As used herein, a system load refers to any electrically powered device. The second drain 18d is coupled to the second battery 14 and the second source 18s is coupled to the system load. In such a manner, the first battery 12 and the second battery 14 are arranged in parallel with each other. The first gate 16g and the second gate 18g are coupled to a driver (not shown), which transmits an electrical signal, typically in the form of a voltage, to turn on or off the first and second switches 16, 18. When the first and second switches 16, 18 are turned on, power is supplied to the system load.

A computer processing unit (CPU) controls the power supply from the first and second batteries 12, 14 to meet the system load demands. This may be done by turning on and off the first and the second switches 16, 18. In particular, the CPU may send a signal to the driver (not shown) or may serve as a driver to turn on and off the first switch 16 and the second switch 18 directly. The power supply system 100 may include current detectors 20 and voltage detectors 22 and the CPU may process the values detected by the current and voltage detectors 20, 22 to turn on and off the first and the second switches 16, 18.

The control circuit 10 is operatively coupled to the first and the second switches 16, 18. The control circuit 10 includes a third switch 24. The third switch 24 is a depletion only type switch which requires a minimum voltage between the gate and the source in order to turn on, wherein a voltage larger than the minimum voltage turns off the third switch 24. Any depletion only type transistor may be used herein, illustratively including a transistor commonly referred to as a JFET.

The third switch 24 includes a third source 24s, a third drain 24d and a third gate 24g. The third drain 24d is connected to the first gate 16g and the second gate 18g of the first switch 16 and the second switch 18 and the third source 24s is connected to the first source 16s and the second source 18s of the first switch 16 and the second switch 18. The third gate 24g is connected to ground, wherein in the event of a ground fault, e.g., a short caused by a disconnection to the ground, a voltage at the third gate 24g and third source 24s of the third switch 24 is the same, turning on the third switch 24 and shorting the first gate 16g, first source 16s, the second gate 18g and the second source 18s of the first switch 16, and the second switch 18 so as to turn off the first switch 16 and the second switch 18.

The control circuit 10 may further include a first resistor R1 interposed between the third gate 24g and the third source 24s of the third switch 24. The first resistor R1 generates a voltage drop from the third source 24s to the third gate 24g so as to limit the voltage at the third gate 24g of the third switch 24. In addition, the first resistor R1 limits the current applied to the third gate 24g by dividing the current at a node (N1) between the third gate 24g and the first resistor R1.

In another aspect of the control circuit 10, the control circuit 10 includes a first diode D1 interposed between the first gate 16g and the second gate 18g of the first and second switches 16, 18 and the third drain 24d of the third switch 24. For illustrative purposes, the first diode D1 is disposed on an electrical line (L1) which is downstream node (N2) that is interposed between the first and second gates 16g, 18g of the first and second switches 16, 18 and the third drain 24d of the third switch 24. The first diode D1 has a cathode facing the third drain 24d of the third switch 24 so as to prevent backflow current from reaching the first and second gates 16g, 18g of the first and second switches 16, 18.

The control circuit 10 may further include a second resistor R2 interposed between the first diode D1 and the third drain 24d of the third switch 24 and a third resistor R3 interposed between the third gate 24g of the third switch 24 and a ground. The first resistor R1 and the third resistor R3 are connected at node (N1) interposed between the third gate 24g and the first and third resistors R1, R3. The first and third resistors R1, R3 are operable to limit the current applied to the third gate 24g.

The control circuit 10 further includes a first Zener diode ZD1 interposed between the third gate 24g and the third drain 24d. The first Zener diode ZD1 is configured to protect the third switch 24 in the event of a reverse current condition. As is known to those skilled in the art, a reverse current condition is a condition in which current flows in a direction opposite of its intended design, such a condition may be caused when the connection of the first and second batteries 12, 14 are reversed, or when a backflow of current is generated by an open circuit and a power surge.

In another aspect, the control circuit 10 further includes a second Zener diode ZD2 and a third Zener diode ZD3. The second Zener diode ZD2 and the third Zener diode ZD3 are disposed on an electrical path and interposed between the third gate 24g and the third source 24s of the third switch 24. The electrical path is joined to node (N3) interposed between the third resistor R3 and the first resistor R1. A cathode of the second Zener diode ZD2 and a cathode of the third Zener diode ZD3 face each other so as to protect the third gate 24g and the third source 24s of the third switch 24 during a reverse battery condition and a normal connection condition. In particular, the cathode of the third Zener diode ZD3 is oriented to prevent a current from a reverse battery condition, and the second Zener diode ZD2 is oriented to protect the third gate 24g during normal connection conditions.

With reference again to FIGS. 2A and 2B, a depiction of a power supply system 100 is provided. For illustrative purposes, the power supply system 100 is incorporated into an automotive vehicle (not shown). The power supply system 100 includes a first battery 12 and a second battery 14. The first battery 12 includes a first capacitance and the second battery 14 includes a second capacitance.

In one aspect the first capacitance is different than the second capacitance. In such an aspect, the first capacitance is greater than the second capacitance. However, it should be appreciated that the first capacitance may be the same as the second capacitance without deviating from the scope of the appended claims. For illustrative purposes, the power system disclosed herein is configured such that the first battery 12 and the second battery 14 are 12 volt batteries but the first capacitance is greater than the second capacitance. In such an aspect, the first battery 12 is configured to provide power to a motor for driving or assisting in the drive of the automotive vehicle as well as powering vehicle loads. The second battery 14 may be configured to augment or otherwise charge the first battery 12 as well as provide power to the vehicle loads.

The power supply system 100 further includes a first switch 16 and a second switch 18. The first switch 16 and the second switch 18 are MOSFETs. The MOSFETs are configured to turn on when the differential between the gate and the source is between 2 to 3 volts. In one aspect, the first switch 16 and the second switch 18 are N-channel MOSFETs. The first switch 16 and the second switch 18 are coupled to the first battery 12 and the second battery 14, respectively, and are operable to control the power supply from the first and second battery 14 by turning the first switch and the second switch 16, 18 on and off.

The first switch 16 includes a first source 16s, a first drain 16d and a first gate 16g. The second switch 18 includes a second source 18s, a second drain 18d and a second gate 18g. The first drain 16d is coupled to the first battery 12 and the first source 16s is coupled to the vehicle loads, to include the motor. The second drain 18d is coupled to the second battery 14 and the second source 18s is coupled to the vehicle loads, to include the motor. In such a manner, the first battery 12 and the second battery 14 are arranged in parallel with each other as the first and second source 16s, 18s are joined at node (N4). The first gate 16g and the second gate 18g are coupled to a driver (not shown), which transmits an electrical signal, typically in the form of a voltage, to turn on or off the first and second switches 16, 18. When the first and second switches 16, 18 are turned on, power is supplied to the vehicle loads.

A computer processing unit (CPU) controls the power supply from the first and second batteries 12, 14 to meet the vehicle demands. This may be done by turning on and off the first and the second switches 16, 18. In particular, the CPU may send a signal to the driver (not shown) or may serve as a driver to turn on and off the first switch 16 and the second switch 18 directly. The power supply system 100 may include current detectors 20 and voltage detectors 22 and the CPU may process the values detected by the current and voltage detectors 22 to turn on and off the first and the second switch 18.

The control circuit 10 is operatively coupled to the first and the second switches 16, 18. The control circuit 10 includes a third switch 24. The third switch 24 is a depletion only type switch which requires a minimum voltage differential between the gate and the source in order to turn the third switch 24 on, wherein a voltage at the gate turns off the third switch 24. Any depletion only type transistor may be used herein, illustratively including a transistor commonly referred to as a JFET. Preferably, the third switch is operable to turn on when a differential between the gate and the source is 0-2 volts.

The third switch 24 includes a third source 24s, a third drain 24d and a third gate 24g. The third drain 24d is connected to the first gate 16g and the second gate 18g of the first switch 16 and the second switch 18 and the third source 24s is connected to the first source 16s and the second source 18s of the first switch 16 and the second switch 18, and the third gate 24g is connected to ground, wherein in the event of a ground fault a voltage at the third gate 24g and third source 24s of the third switch 24 is the same, turning on the third switch 24 and shorting the first gate 16g, first source 16s, the second gate 18g and the second source 18s of the first switch 16 and the second switch 18 so as to turn off the first switch 16 and the second switch 18.

The control circuit 10 may further include a first resistor R1 interposed between the third gate 24g and the third source 24s of the third switch 24. In the context of the automotive vehicle described herein, where the first battery 12 has a capacitance of 24 volts and the second battery 14 has a capacitance of 12 volts, the first resistor R1 may have a value of 2.2 MΩ (megaohms). The first resistor R1 generates a voltage drop from the third source 24s to the third gate 24g so as to limit the voltage at the third gate 24g of the third switch 24. In addition, the first resistor R1 limits the current applied to the third gate 24g by dividing the current at node (N1) between the third source 24s and the first and second sources 16s, 18s of the respective first and second switches 16, 18.

In another aspect of the control circuit 10, the control circuit 10 includes a first diode D1 interposed between the first gate 16g and the second gate 18g and the third drain 24d of the third switch 24. The first diode D1 has a value of 150 mA (milliamps). For illustrative purposes, the first diode D1 is disposed on an electrical line which is downstream of node (N2) that is interposed between the first and second gates 16g, 18g of the first and second switches 16, 18 and the third drain 24d of the third switch 24. The first diode D1 has a cathode facing the third drain 24d of the third switch 24 so as to prevent backflow current from reaching the first and second gates 16g, 18g of the first and second switches 16, 18.

The control circuit 10 may further include a second resistor R2 interposed between the first diode D1 and the third drain 24d of the third switch 24 and a third resistor R3 interposed between the third gate 24g of the third switch 24 and a ground. The second resistor R2 may have a value of 100Ω (ohms) and the third resistor R3 has a value of 47 kΩ (Kiloohms). The first resistor R1 and the third resistor R3 are connected at node (N1) interposed between the third gate 24g and the first and third resistors R1, R3. The first and third resistors R1, R3 are operable to limit the current applied to the third gate 24g.

The control circuit 10 further includes a first Zener diode ZD1 interposed between the third gate 24g and the third drain 24d. The first Zener diode ZD1 has a value of 24 volts. The first Zener diode ZD1 is configured to protect the third switch 24 in the event of a reverse current condition.

In another aspect, the control circuit 10 further includes a second Zener diode ZD2 and a third Zener diode ZD3. The second Zener diode ZD2 and the third Zener diode ZD3 each have a value of 24 volts. The second Zener diode ZD2 and the third Zener diode ZD3 are disposed on an electrical path and interposed between the third gate 24g and the third source 24s of the third switch 24. The electrical path is joined to node (N3) interposed between the third resistor R3 and the first resistor R1. A cathode of the second Zener diode ZD2 and a cathode of the third Zener diode ZD3 face each other so as to protect the third gate 24g and the third source 24s of the third switch 24 during a reverse battery condition and a normal connection condition. In particular, the cathode of the third Zener diode ZD3 is oriented to prevent a current from a reverse battery condition, and the second Zener diode ZD2 is oriented to protect the third gate 24g during normal connection conditions.

With reference again to FIGS. 2A and 2B, the power supply system 100 is shown operating under normal connection conditions, that is, a ground fault has not occurred. During normal connection conditions, the third switch 24 is turned off. In particular, the voltage at the third gate 24g is low (for example, 0.25 volts), and the voltage at the third source 24s is equivalent to the voltage at the first and/or second source 18s, which is 12 volts. Thus, the voltage differential between the third gate 24g and the third source 24s is 11.75 volts which is greater than the range of 0-2 volts needed to turn on the third switch 24. As such, when the third switch 24 is turned off, the operation of the first and second switches 16, 18 is not affected.

Figure 3A:
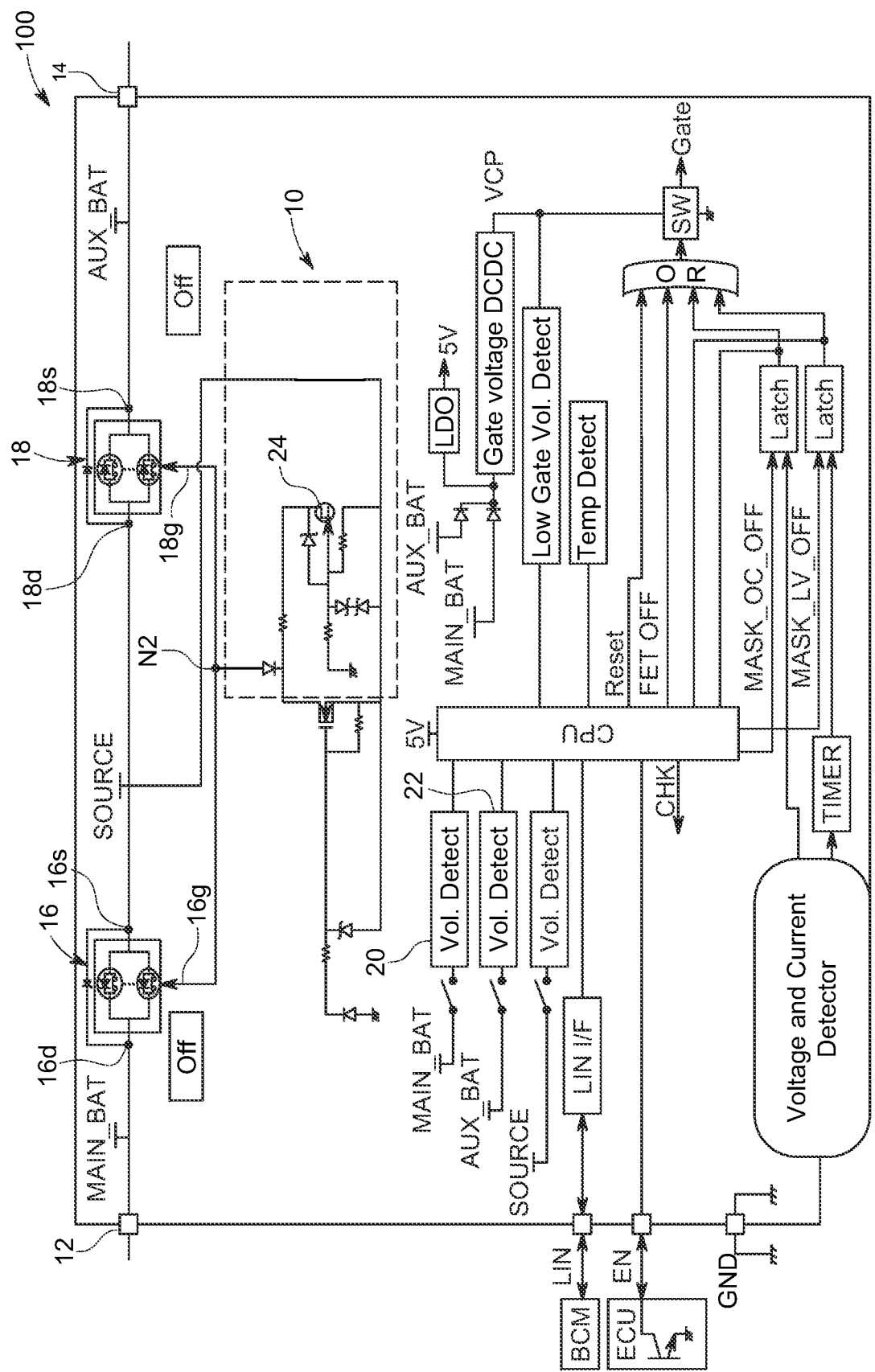
FIG. 3A is an illustrative schematic view of a power supply system shown in FIG. 2A during a ground fault.
Figure 3B:
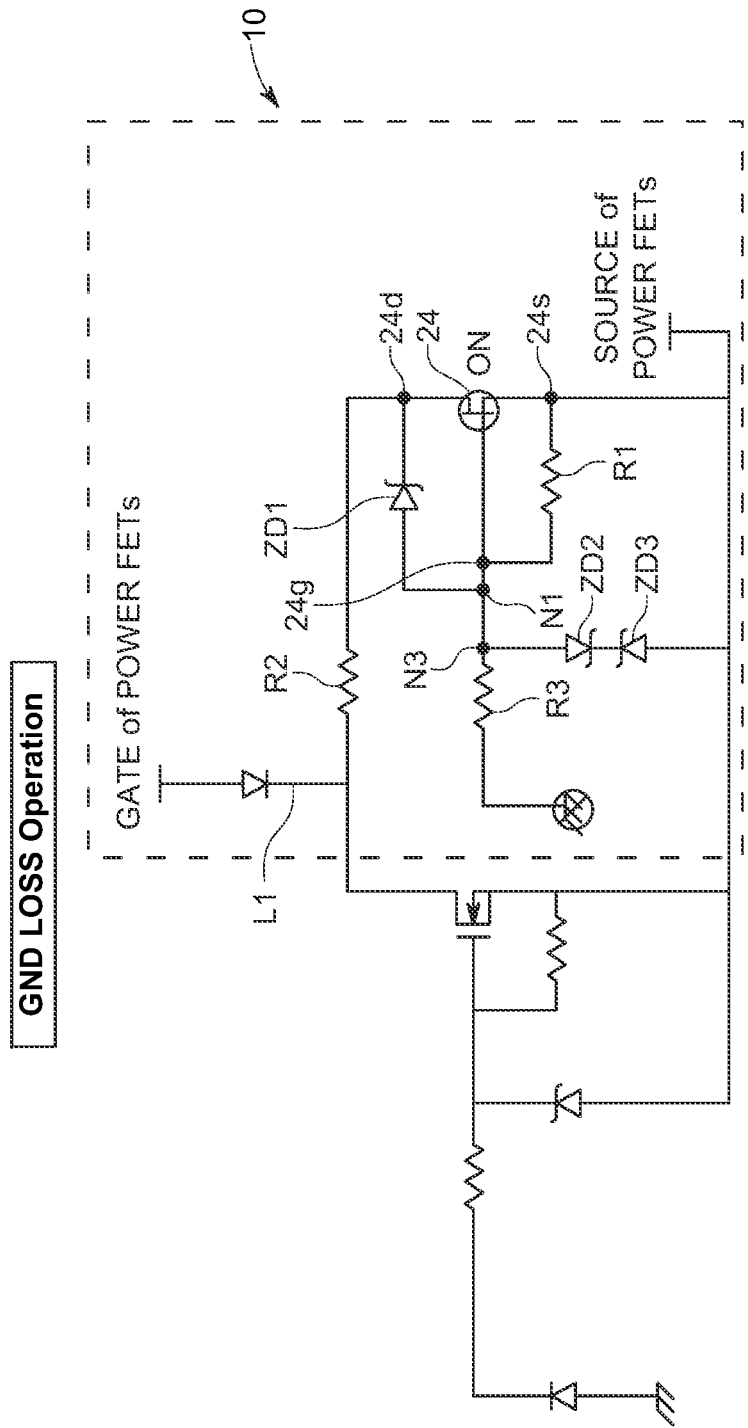
FIG. 3B is a schematic view of the control circuit shown in FIG. 2A in a ground fault operation.

With reference now to FIGS. 3A and 3B, the power supply is shown as having a ground fault. This may be caused by a loose wire. In such an instance, the electric path is disconnected creating an open circuit, in which case the first resistor R1 brings the voltage at the third gate 24g equal to the voltage at the third source 24s, in this case, 12 volts. In other words, the voltage at the third gate 24g is 12 volts and the voltage at the third source is also 12 volts. As the third switch 24 is a depletion only switch which is turned on when the voltage differential between the third gate 24g and the second gate 18g is between 0 to 2 volts, the third switch 24 is turned on. In this case, the voltage differential between the third gate 24g and the third source 24s is 0, and thus the third switch 24 is turned on. When the third switch 24 is turned on, the voltage at the first gate 16g and the second gate 18g of the first and second switches 16, 18 are equal to the voltage at the first source 16s and second source 18s of the first and second switches 16, 18, turning off the first and second switches 16, 18. As described above, the first and second switches 16, 18 are MOSFET switches that require a gate-to-source differential of 2 to 3 volts to be turned on. Accordingly, a power supply system 100 and a control circuit 10 for a power supply system 100 is provided which is configured to turn off the first and second switches 16, 18 during a ground fault event without requiring a signal from the CPU.

In the event that the ground fault is corrected, the third switch 24 is turned off and the CPU may resume control operations of the first and second switches 16, 18.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A control circuit for a power supply system, the power supply system including a first battery and a second battery and a first switch having a first source, a first drain and a first gate and a second switch having a second source, a second drain and a second gate configured to turn on and off power supply from the first battery and the second battery respectively, the control circuit comprising:
a third switch having a third source, a third drain and a third gate, wherein the third drain is connected to the first gate and the second gate of the first switch and the second switch and the third source is connected to the first source and the second source of the first switch and the second switch, and wherein the third gate is connected to a ground, wherein in the event of a short caused by a disconnection to ground, a voltage at the third gate and third source of the third switch is the same, turning on the third switch and shorting the first gate, first source, the second gate and the second source of the first switch and the second switch so as to turn off the first switch and the second switch.

2. The control circuit as set forth in claim 1, wherein the first switch and the second switch are an N-channel Field-Effect Transistor (FET).

3. The control circuit as set forth in claim 2, wherein the third switch is a depletion only type transistor.

4. The control circuit as set forth in claim 3, wherein the third switch is a JFET.

5. The control circuit as set forth in claim 4, further including a first resistor interposed between the third gate and the third source of the third switch.

6. The control circuit as set forth in claim 4, further including a first diode interposed between the first gate and the second gate and the third drain of the third switch.

7. The control circuit as set forth in claim 4, further including a second resistor interposed between the first gate and the second gate and the third drain of the third switch.

8. The control circuit as set forth in claim 7, further including a first diode interposed between the first gate and the second gate and the third drain of the third switch, the second resistor interposed between the first diode and the third drain of the third switch.

9. The control circuit as set forth in claim 4, further including a third resistor interposed between the third gate of the third switch and the ground.

10. The control circuit as set forth in claim 4, further including a first Zener diode interposed between the third gate and the third drain.

11. The control circuit as set forth in claim 4, further including a second Zener diode and a third Zener diode, the second Zener diode and the third Zener diode are interposed between the third gate and the third source of the third switch.

12. The control circuit as set forth in claim 11, wherein a cathode of the second Zener diode and a cathode of the third Zener diode face each other.

13. A power supply system comprising:
a first battery having a first capacitance;
a second battery having a second capacitance that is different than the first capacitance;
a first switch having a first source, a first drain and a first gate;
a second switch having a second source, a second drain and a second gate; the first switch and the second switch configured to turn on and off power supplied from the first battery and the second battery respectively; and
a control circuit, the control circuit including a third switch having a third source, a third drain and a third gate, wherein the third drain is connected to the first gate and the second gate of the first switch and the second switch and the third source is connected to the first source and the second source of the first switch and the second switch, and wherein the third gate is connected to a ground, wherein in the event of a short caused by a disconnection to ground, a voltage at the third gate and third source of the third switch is the same, turning on the third switch and shorting the first gate, first source, the second gate and the second source of the first switch and the second switch so as to turn off the first switch and the second switch.

14. The power supply system as set forth in claim 13, wherein the first switch and the second switch are an N-channel Field-Effect Transistor (FET).

15. The power supply system as set forth in claim 14, wherein the third switch is a depletion only type transistor.

16. The power supply system as set forth in claim 15, further including a first resistor interposed between the third gate and the third source of the third switch.

17. The power supply system as set forth in claim 16, including a first diode and a second resistor, the first diode interposed between the first gate and the second gate and the third drain of the third switch, the second resistor interposed between the first diode and the third drain of the third switch.

18. The power supply system as set forth in claim 17, further including a third resistor interposed between the third gate of the third switch and the ground.

19. The power supply system as set forth in claim 18, further including a first Zener diode interposed between the third gate and the third drain.

20. The power supply system as set forth in claim 19, further including a second Zener diode and a third Zener diode, the second Zener diode and the third Zener diode are interposed between the third gate and the third source of the third switch.

* * * * *